United States Patent
Chang et al.

(10) Patent No.: US 9,198,335 B2
(45) Date of Patent: Nov. 24, 2015

(54) METHOD AND APPARATUS FOR PROCESSING HOUSING

(71) Applicant: Samsung Electronics Co., Ltd., Gyeonggi-do (KR)

(72) Inventors: Min-Su Chang, Incheon (KR); Soon-Ho Han, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 157 days.

(21) Appl. No.: 13/901,729

(22) Filed: May 24, 2013

(65) Prior Publication Data

US 2013/0342977 A1 Dec. 26, 2013

(30) Foreign Application Priority Data

Jun. 25, 2012 (KR) .................. 10-2012-0067888

(51) Int. Cl.
| | |
|---|---|
| G06F 1/16 | (2006.01) |
| H05K 13/00 | (2006.01) |
| B44C 5/04 | (2006.01) |
| B44F 9/10 | (2006.01) |
| H05K 5/02 | (2006.01) |
| H05K 5/03 | (2006.01) |
| B29C 37/00 | (2006.01) |
| B29C 45/14 | (2006.01) |
| B29C 45/37 | (2006.01) |
| H04M 1/02 | (2006.01) |
| B29L 31/34 | (2006.01) |

(52) U.S. Cl.
CPC ........ *H05K 13/0084* (2013.01); *B29C 37/0032* (2013.01); *B29C 37/0053* (2013.01); *B29C 45/14827* (2013.01); *B29C 45/372* (2013.01); *B44C 5/0453* (2013.01); *B44F 9/10* (2013.01); *H05K 5/0217* (2013.01); *H05K 5/03* (2013.01); *B29C 37/0067* (2013.01); *B29C 2037/0042* (2013.01); *B29L 2031/3481* (2013.01); *H04M 1/0249* (2013.01); *H04M 1/0283* (2013.01)

(58) Field of Classification Search
USPC ......... 200/517, 108; 345/184, 173, 575.4, 76;
455/566, 41.2, 556.1, 77, 567, 575.1,
455/575.4; 361/679.26, 679.55, 679.56,
361/679.41, 679.37, 679.33, 679.34;
312/223.1, 7.2, 223.2, 333, 319.2;
248/224.8, 298.1, 618, 633, 265.5, 534
See application file for complete search history.

(56) References Cited

U.S. PATENT DOCUMENTS

| | | | |
|---|---|---|---|
| 5,639,536 A | 6/1997 | Yamazaki et al. | |
| 6,984,799 B2 * | 1/2006 | Kawaguchi et al. | .......... 200/512 |
| 2005/0158617 A1 * | 7/2005 | Satoh et al. | ...................... 429/96 |
| 2005/0260386 A1 * | 11/2005 | Heinrich et al. | ............... 428/141 |

(Continued)

FOREIGN PATENT DOCUMENTS

| | | |
|---|---|---|
| CN | 101110850 A | 1/2008 |
| EP | 1 669 191 A1 | 6/2006 |

(Continued)

*Primary Examiner* — Hung Duong (74) *Attorney, Agent, or Firm* — Cha & Reiter, LLC.

(57) ABSTRACT

A method for processing a housing for devices such as electronic devices. A hairline is formed on an inner surface of an inmold mold. In addition, a hairline is formed on an inmold film. The inmold film is positioned inside the inmold mold and a housing representing the hairline of the inmold mold and the hairline of the inmold film together is formed using inmold injection molding.

25 Claims, 9 Drawing Sheets

(56) References Cited

U.S. PATENT DOCUMENTS

| | | | |
|---|---|---|---|
| 2007/0026197 A1 | 2/2007 | Suga et al. | |
| 2009/0051620 A1* | 2/2009 | Ishibashi et al. | 343/897 |
| 2009/0314340 A1* | 12/2009 | Schindler et al. | 136/256 |
| 2011/0134300 A1* | 6/2011 | Chung | 348/333.01 |
| 2011/0189445 A1* | 8/2011 | Takeuchi et al. | 428/195.1 |

FOREIGN PATENT DOCUMENTS

| | | | |
|---|---|---|---|
| EP | 1 880 821 A1 | 1/2008 | |
| JP | 01141014 | * 6/1989 | ......... H04M 1/0272 |
| JP | 04-191022 A | 7/1992 | |
| KR | 2001-0107880 A | 12/2001 | |
| KR | 10-2006-0004440 A | 1/2006 | |
| KR | 10-0816530 B1 | 3/2008 | |
| KR | 10-2010-0053002 A | 5/2010 | |

* cited by examiner

METHOD AND APPARATUS FOR PROCESSING HOUSING

CLAIM OF PRIORITY

This application claims the benefit of priority under 35 U.S.C. §119(a) of a Korean patent application filed in the Korean Intellectual Property Office on Jun. 25, 2012 and assigned Ser. No. 10-2012-0067888, the entire disclosure of which is hereby incorporated by reference in its entirety.

BACKGROUND

1. Field of the Invention

The present disclosure relates to a method and an apparatus for processing a housing for an electronic device.

2. Description of the Related Art

Electronic devices, such as portable electronic devices of stationary home or office appliances, are being purchased these days not only for reasons of functionality and price, but also according to the esthetics of their appearance. In order to meet a user's esthetic requirement, a housing for an electronic device is formed by being surface-processed, so that the appearance becomes elegant.

An example of one type of surface processing comprises hairline processing. In general, hairline processing denotes a process of drawing one or more thin lines on a metal plate such as aluminum and stainless. The hairline processing prevents glaring, which can cause a dazzle reflex by light shining off a glossy housing. In addition, hairline processing provides unique metal luster, removes or hides scratches or a damage marks on the surface of the housing, and makes the quality of a metal product more luxurious. There is a need for hairline processing techniques and its surface processing technology and equipment to improve as more various esthetic requirements in an aspect of recent high-priced digital home appliances have heightened consumer expectations that require improved quality and places a larger emphasis on an elegant appearance.

In general, a person of ordinary skill in the art manufactures a housing using a conventional method of attaching an inmold film to an injected material via inmold injection molding.

First, a person of ordinary skill in the art was able to provide a hairline of a housing by forming a print layer that prints hairline patterns on an inmold film and attaching the print layer of the inmold film to an injected material via the inmold injection molding. This method of forming a print layer is easy in expressing a hairline, but since the surface of a housing is smooth, the smooth texture associated with touching real metal cannot be achieved with this method.

Second, a person of ordinary skill in the art was also conventionally able to provide a hairline to a housing by unevenly forming a Polyethylene Terephthalate (PET) film on an inmold film using a brush, coating a coating layer representing an outline of the unevenly formed hairline, and attaching the coating layer representing the outline of the unevenly formed hairline on an injected material via the inmold injection molding. The unevenness of the coating layer may be formed in more detail by forming an uneven depth of the PET film deep, but since there is a limitation in deepening the depth of the unevenness due to a limit of the thickness of the PET film, there is a difficulty in expressing the surface of a real metal.

Consequently, the conventional hairline processing method has a limit in expressing texture of real metal, and so there is a need in the art for a new alternative of hairline processing.

SUMMARY

An aspect of the present invention is to address at least some of the above-mentioned problems and/or disadvantages and to provide at least the advantages described below. Accordingly, an aspect of the present invention is to provide a method and an apparatus for processing a housing representing a hairline allowing for the housing to retain the texture of real metal.

Another exemplary aspect of the present invention is to provide a method and an apparatus for processing a housing, for representing a hairline of an inmold film and a hairline of a mold together in case of manufacturing a housing of a device using inmold injection molding.

In accordance with an exemplary aspect of the present invention, a method for processing a housing is provided. The method includes forming a first hairline on an inner surface of an inmold mold, forming a second hairline on an inmold film, and positioning the inmold film inside the inmold mold to form a housing representing the first hairline of the inmold mold and the second hairline of the inmold film such that the first hairline and the second hairline overlap each other using inmold injection molding.

In accordance with another exemplary aspect of the present invention, an apparatus for processing a housing includes an inmold film on which a first hairline is formed, and an inmold mold for forming a housing having an inner surface that includes a second hairline thereon, positioning the inmold film inside the housing, and representing the second hairline of the inner surface and the first hairline of the inmold film such that the first hairline and the second hairline overlap each other when inmold injection is performed.

In accordance with still another exemplary aspect of the present invention, a portable terminal is provided. The portable terminal preferably includes a plurality of electronic parts, and a housing having a space for arranging the electronic parts and forming an appearance, wherein the housing positions an inmold film where a second hairline has been formed inside an inmold mold whose inner surface includes a first hairline thereon and performs inmold injection, thereby representing the first hairline of the inner surface of the inmold mold and the second hairline of the inmold film such that the first hairline and the second hairline overlap each other.

Other exemplary aspects, advantages and salient features of the invention will become more apparent to those skilled in the art from the following detailed description, which, taken in conjunction with the annexed drawings, discloses exemplary embodiments of the invention.

BRIEF DESCRIPTION OF THE DRAWINGS

The above and other exemplary aspects, features and advantages of certain exemplary embodiments of the present invention are discussed herein below in the following description taken in conjunction with the accompanying drawings in which.

Throughout the drawings, like reference numerals will be understood to refer to like parts, components and structures.

DETAILED DESCRIPTION

The following description with reference to the accompanying drawings is provided to assist a person of ordinary skill in the art with a comprehensive understanding of exemplary embodiments as defined by the claims and their equivalents. The description includes various specific details to assist the artisan with that understanding but these details are to be regarded as merely exemplary. Accordingly, those of ordinary skill in the art will recognize that various changes and modifications of the examples described herein can be made without departing from the scope and spirit of the invention. Also, descriptions of well-known functions and constructions may be omitted for clarity and conciseness so as not to obscure appreciation by the artisan of the subject matter of the claimed invention with description of such well-known functions and constructions.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purposes only and not for the purpose of limiting the invention as defined by the appended claims and their equivalents.

Exemplary embodiments of the present invention provide a processing method and an apparatus thereof, for allowing a construction of a housing forming an appearance of a device to have a texture of real metal. The hairline is one such way to enhance the appearance of the device. Other examples discussed herein provide an apparatus and a method for processing a housing representing a hairline of an inmold film and a hairline of a mold together in case of manufacturing a housing of a device using inmold injecting molding.

Figure 1A:
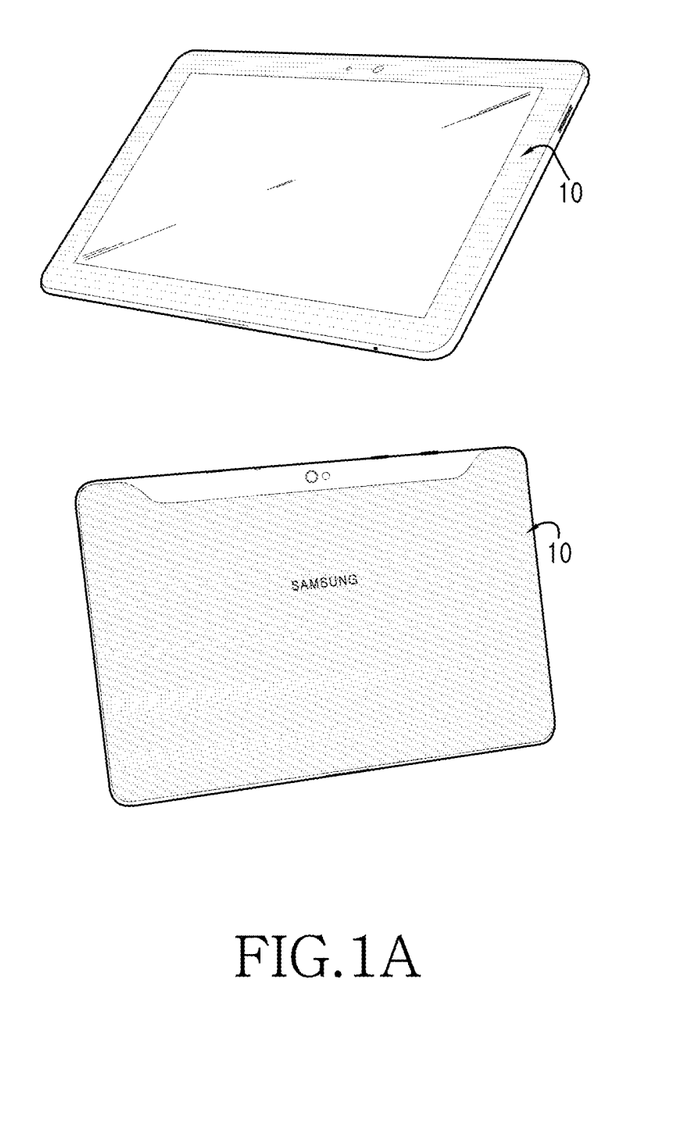
FIG. 1A is a perspective view illustrating an electronic device according to an exemplary embodiment of the present invention.

FIG. 1A is a perspective view illustrating an electronic device according to an exemplary embodiment of the present invention.

Referring now to FIG. 1A, the electronic device, such as a tablet personal computer, includes a housing 10 having an exterior appearance. The housing 10 has hairlines formed for having a visual effect of looks as though the housing has a metal texture. Particularly, since the housing 10 represents a more detailed hairline visually by allowing a hairline corresponding to a hairline formed on a mold and a hairline formed on an inmold film to overlap each other during an inmold injection mold process, texture of real metal is achieved. A hairline processing procedure according to the present invention is described with reference to the accompanying drawings.

Figure 1B:
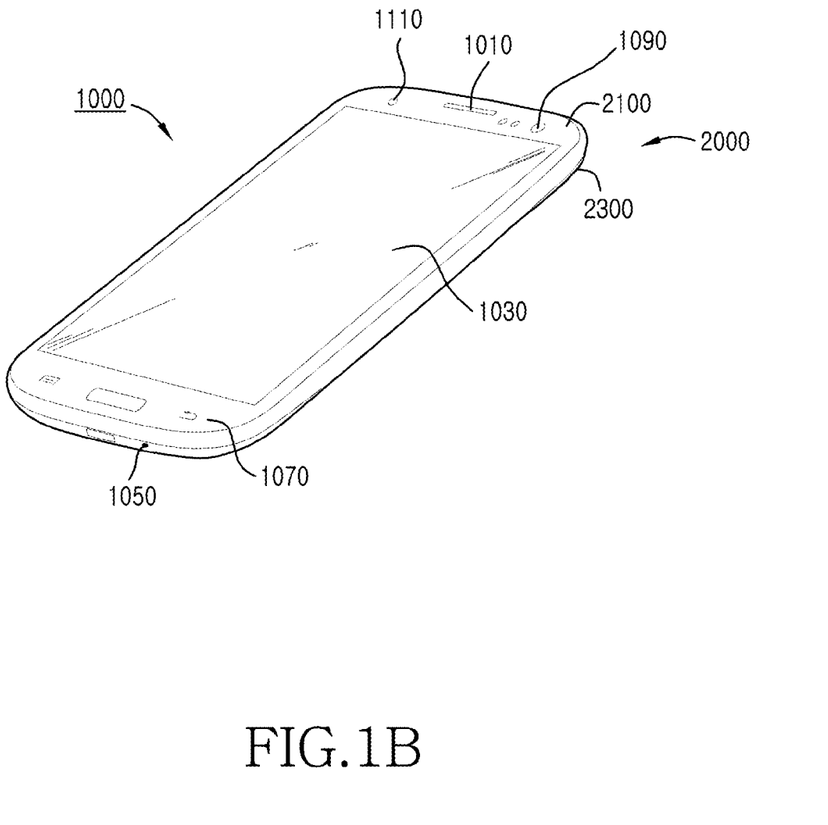
FIG. 1B is a perspective view illustrating the front of another electronic device according to an exemplary embodiment of the present invention.
Figure 1C:
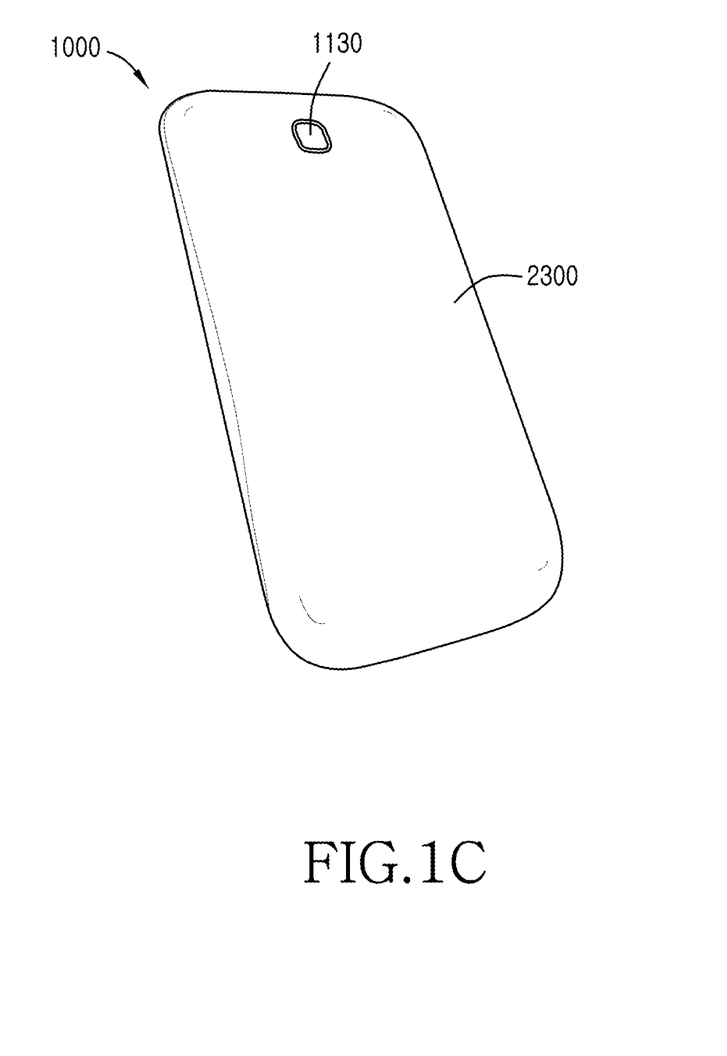
FIG. 1C is a perspective view illustrating the back of the electronic device shown in FIG. 1B.
Figure 1D:
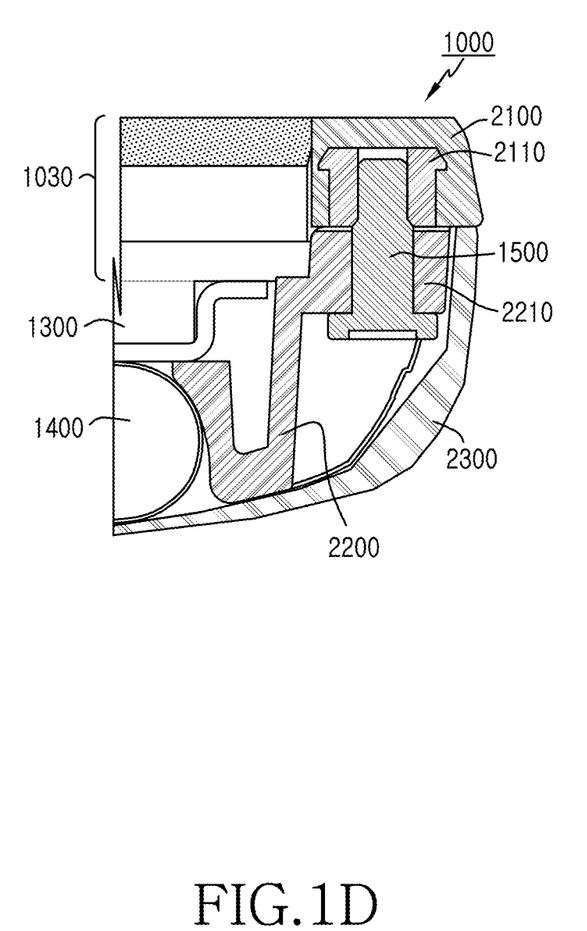
FIG. 1D is a partial view of a cross section of the electronic device shown in FIG. 1B.
Figure 1E:
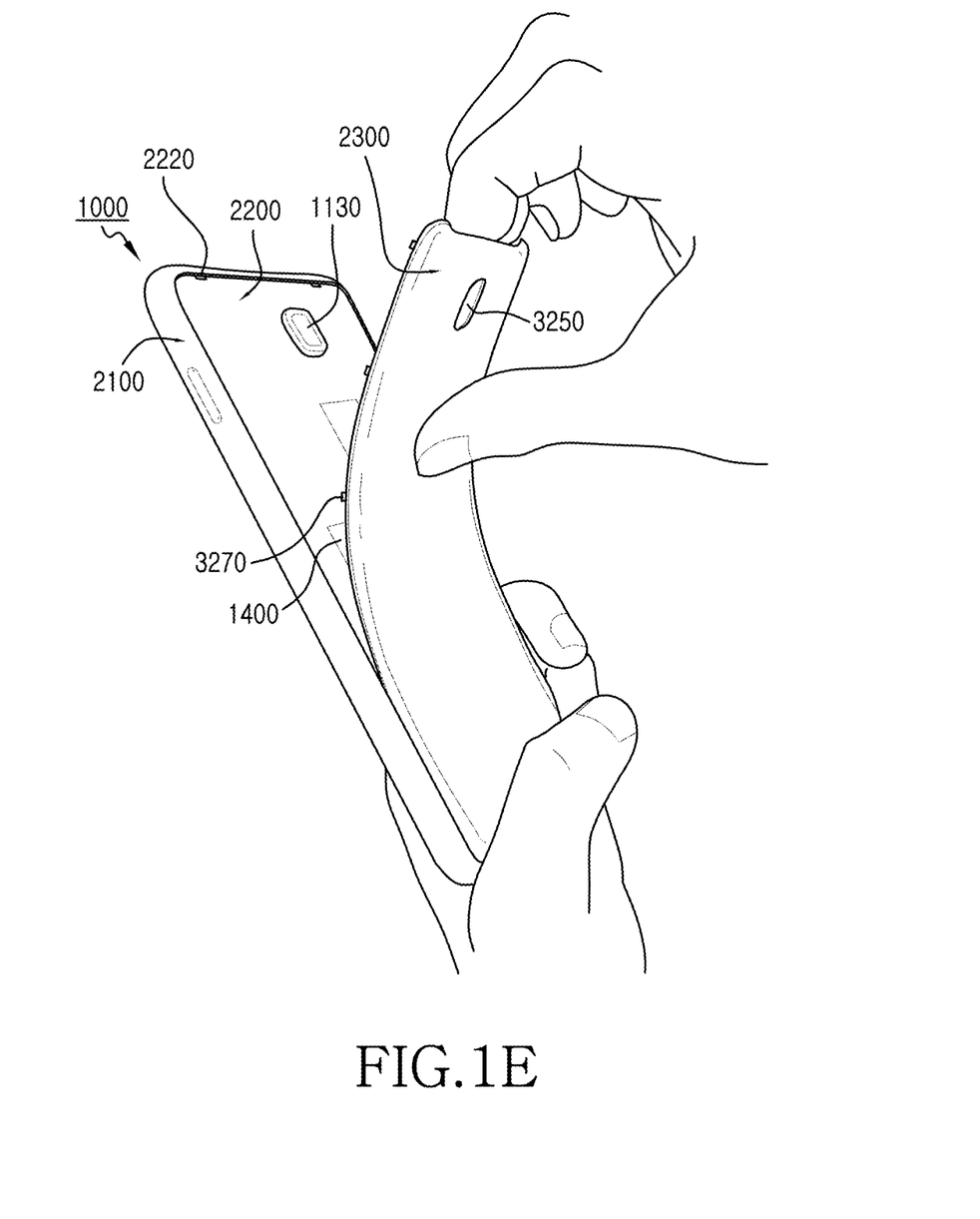
FIG. 1E illustrates attachment/detachment of a rear cover of a portable terminal according to an exemplary embodiment of the present invention.

FIGS. 1B, 1C are perspective views illustrating a portable terminal according to an exemplary embodiment of the present invention, FIG. 1D is a partial cross-sectional view a structure of a portable terminal according to an exemplary embodiment of the present invention, and FIG. 1E illustrates attachment/detachment of a rear cover of a portable terminal according to an exemplary embodiment of the present invention.

Referring now to FIGS. 1B, 1C and 1D, the portable terminal 1000 shown in this example includes a speaker assembly 1010 for outputting sound, a touchscreen display 1030 positioned adjacent the speaker unit 1010, in which the touchscreen displaying an image and can receive a touch input, a microphone unit 1050 is positioned adjacent the touchscreen display 1030 and receiving sound, an optional keypad 1070 where input buttons have been arranged, a front camera 1090, and a rear camera 1130.

The portable terminal 1000 has a housing 2000 with an exterior appearance. The above-described elements are received in a receiving space of the housing 2000. The housing 2000 includes a front housing 2100, a rear housing 2200 (shown in FIG. 1E), and a rear cover 2300.

The front housing 2100 and the rear housing 2200 couple to each other to form a space for receiving internal elements of the portable terminal 1000. The rear cover 2300 (shown in FIG. 1C) covers the rear housing 2200. The front housing 2100 is disposed on the front side of the portable terminal 1000, and the rear cover 2300 is disposed on the rear side of the portable terminal 1000.

With reference to FIGS. 1D and 1E, the front housing 2100 and the rear housing 2200 couple to each other to form a container shape that is open toward the front direction of the portable terminal 1000. The touchscreen unit 1030 is disposed on a mainboard 1300 (system board) and includes a display window. The touchscreen unit 1030 and the mainboard 1300 are mounted in the receiving space formed by coupling of the front housing 2100 and the rear housing 2200. An optional battery 1400 is received in a space formed by coupling of the rear housing 2200 and the rear cover 2300. The rear cover 2300 may serve as a battery cover. It is within the spirit and scope of the present invention that a solar cell (not shown) may be arranged on the front of the device to assist with power generation/recharging of power.

The display window is transparent and is exposed to the front side of the portable terminal 1000, and an image generated by the display is output external to the device via the display window. The mainboard denotes a board on which a basic circuit and a plurality of electronic parts have been mounted, such as, for example, a wireless transceiver, a controller including hardware such as a decoder or microprocessor, and storage in the form of a non-transitory machine readable medium. The wireless transceiver can transmit in one or more wireless protocols, for example in RF and in Bluetooth, just to name a few non-limiting possibilities, and sets an execution environment of the portable terminal 1000, maintains information thereof, allows the portable terminal 1000 to be driven stably, and smoothes data input/output exchange of all units of the portable terminal 1000.

With reference to FIG. 1B, the front housing 2100 forms a boss 2110 for screw-fastening with the rear housing 2200.

The boss 2110 has a screw fastening portion in which a screw hole fastened with a screen has been formed. This screw fastening portion is metal and is formed inside the boss 2110 during injection molding. The rear housing 2200 forms a boss fastening hole 2210 screw-coupled with the boss 2110 of the front housing 2100. A screw 1500 passes through the boss fastening hole 2210 of the rear housing 2200, and is fastened to the boss 2110 of the front housing 2100, so that the front housing 2100 and the rear housing 2200 couple to each other. However, the claimed invention is not limited to any particular type of fastener, and the device can be snap-fit, pressure fit, interlocked, or otherwise detachably joined in any of a plurality of ways.

FIG. 1E illustrates attachment/detachment of a rear cover of a portable terminal according to an exemplary embodiment of the present invention. The rear cover 2300 may be connected to the rear housing 2200 or separated from the rear housing 2200. The rear cover 2300 forms a snap-fit 3270 disposed on an edge, and the rear housing 2200 forms a connection recess 2220 corresponding to the snap-fit 3270 on a relevant position of an edge. In the case where the rear housing 2200 and the rear cover 2300 are connected, the snap-fit 3270 is connected to the connection recess 2220. In case of connecting the rear cover 2300 to the rear housing 2200 or separating the rear cover 2300 from the rear housing 2200, the rear cover 2300 is elastically warp-transformed as illustrated. Also, the rear cover 2300 forms an opening 3250 exposing a camera unit 1130 received in the front housing 2100 and the rear housing 2200.

At least one or more of the front housing 2100, the rear housing 2200, and the rear cover 2300 may be manufactured using a housing processing method according to an exemplary embodiment of the present invention.

Figure 2:
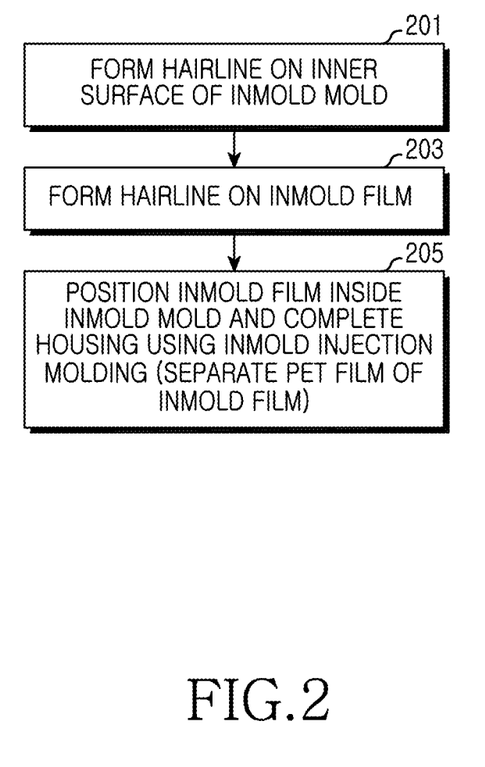
FIG. 2 is a flowchart illustrating a procedure for processing a housing according to an exemplary embodiment of the present invention.

FIG. 2 is a flowchart illustrating an exemplary operational procedure for processing a housing according to an exemplary embodiment of the present invention. The method may be performed as an automated or semi-automated process.

Referring now to FIG. 2, at S201, a person of ordinary skill in the art forms a hairline on an inner surface of an inmold mold. The person of ordinary skill in the art may form a hairline of an uneven shape on the inner surface of the inmold mold using a brush, a sandpaper, a laser, etching, etc. It is also within the spirit and scope of the invention that an automated application of the brush, sandpaper, laser, etc. can be performed.

Next, at S203 a hairline is formed on an inmold film. The inmold film is used for inmold injection molding and may include, for example, one or more of a Polyethylene Terephthalate (PET) film, a release layer, a hard coating layer, a print layer, a reinforcing layer, and a binder layer sequentially stacked on the PET film. The PET film contacts the inner surface of the inmold mold during the inmold injection molding, and when the mold is opened, that is, when the inmold injection molding is completed, the PET film is separated from the inmold film. The release layer smoothly separates the PET film, and the hard coating layer serves as an exposed surface of the housing. The print layer has a logo printed thereon, and a mirror, a background side, a hairline, etc. can be added thereon, which enhances the visual design to the housing. Furthermore, the reinforcing layer reinforces the inmold film, and the binder layer contacts a resin during inmold injection and adheres to an injected resin. A housing manufacturing via the inmold injection molding has a structure where the hard coating layer, the print layer, the reinforcing layer, the binder layer, and the injected resin are sequentially stacked. The person of ordinary skill in the art and/or automated operation may form an uneven surface on the PET film using a brush, and also allow the hard coating layer stacked on the unevenness of the PET film to have a hairline of an unevenness shape corresponding to the unevenness. Also, the hairline can be made on the inmold film by forming the print layer representing the hairline on the inmold film.

Next, the inmold film is positioned inside the inmold mold and a housing processing is completed using the inmold injection molding in step 205. At this point, the PET film of the inmold film is separated. The housing represents a first hairline corresponding to the hairline of the inmold mold on the whole and represents a second hairline of the inmold film along the first hairline in detail.

Meanwhile, the present invention is not limited to allowing a housing to simulate a metal texture by forming a hairline on the housing but may be extended to allowing the housing to have an appearance of a wood texture by forming wood patterns, and accordingly, a corresponding hairline of an inmold mold and a corresponding hairline of an inmold film may be formed.

Figure 3A:
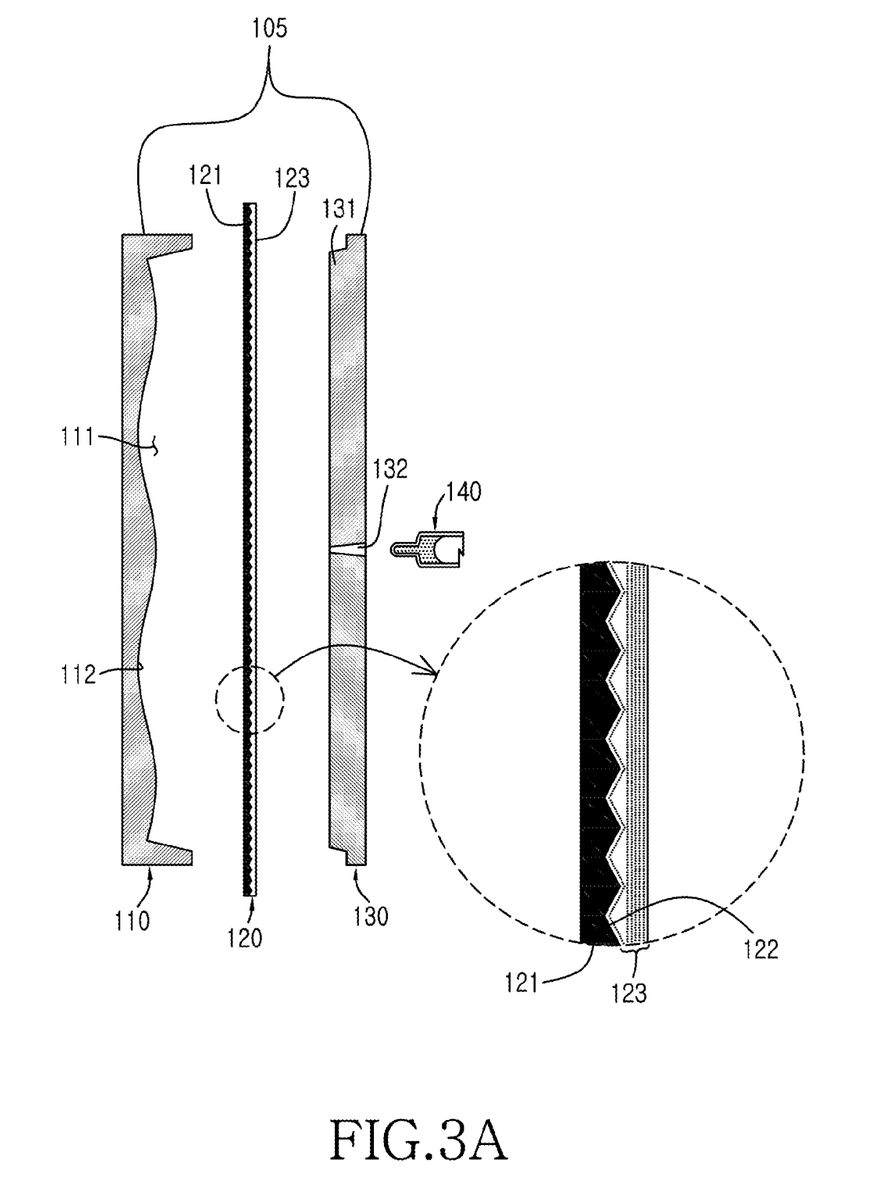
FIG. 3A provides a conceptual view illustrating one portion of a housing processing procedure according to an exemplary embodiment of the present invention.
Figure 3B:
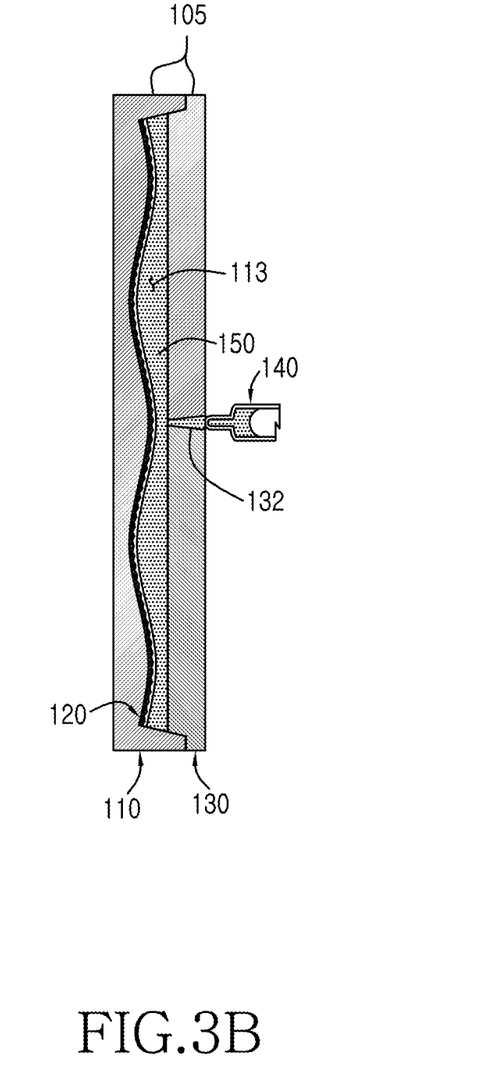
FIG. 3B a view illustrating another portion of the housing processing procedure according to the present invention.
Figure 3C:
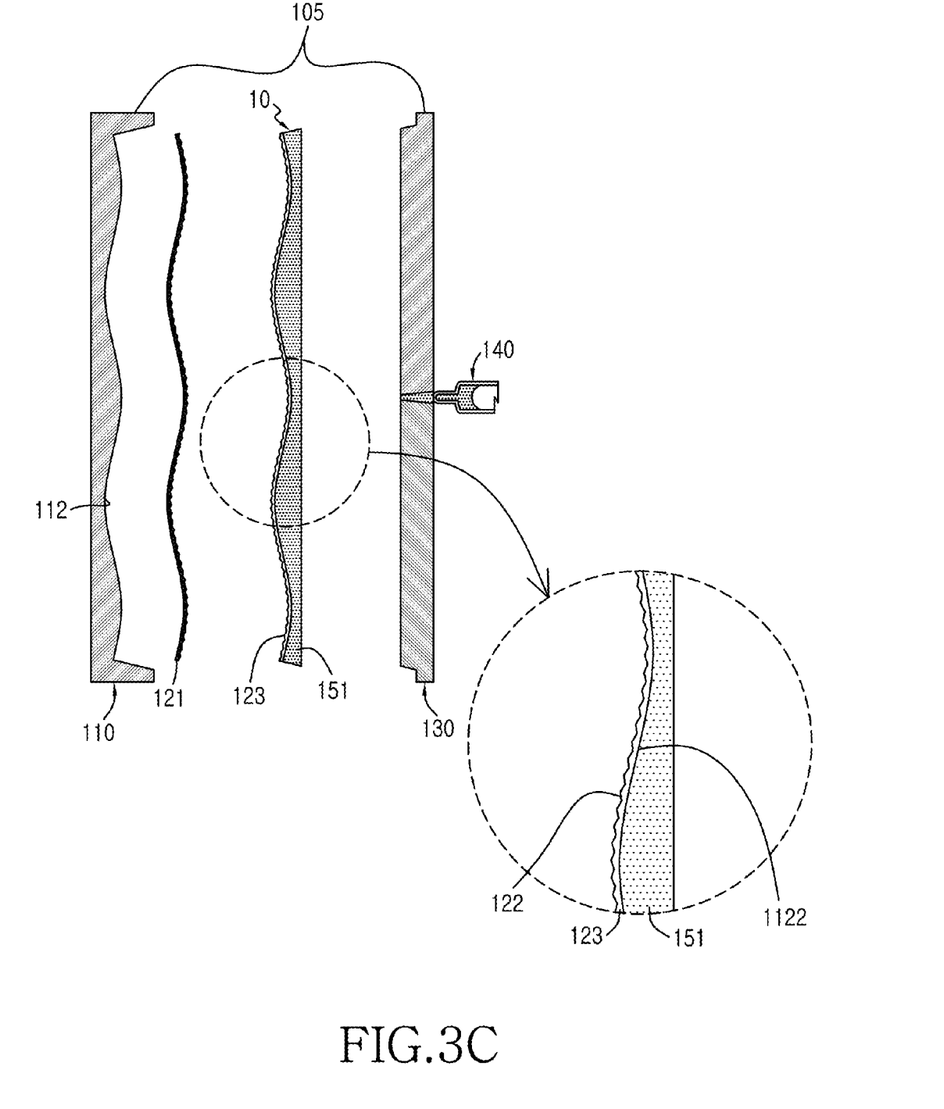
FIG. 3C is a view illustrating the housing construction being completed according to the housing processing procedure of the present invention.

FIGS. 3A to 3C are conceptual views illustrating a housing processing procedure according to an exemplary embodiment of the present invention.

Referring now to FIG. 3A, an inmold mold 105 includes a cavity retainer plate 110 and a core retainer plate 130. The cavity retainer plate 110 forms an empty space formed concave so that a molten resin is introduced. In other words, a cavity 111 is formed. The core retainer plate 130 forms a convex shape, that is a core 131. When the core retainer plate 130 is moved toward and couples to the cavity retainer plate 110 as shown in FIG. 3B, the cavity 111 and the core 131 couple to each other, and a forming space 113 (as shown in FIG. 3B) that can provide a shape of a product being prepared. More particularly, according to the present invention, a first hairline 112 is formed on the inner surface of the cavity retainer plate 110.

With continued reference to FIG. 3A, the inmold film 120 is positioned between the cavity retainer plate 110 and the core retainer plate 130 during inmold injection molding. As described above, the inmold film 120 forms a hairline 122, and a person of ordinary skill in the art understands and appreciates that a hairline 122 of the inmold film 120 can be formed to have an uneven surface on a PET film 121. The person of ordinary skill in the art and/or automated operation may form an uneven surface on the PET film 121 using a brush, and also allow the hard coating layer 123 stacked on the unevenness of the PET film 121 to have a hairline 122 of an unevenness shape corresponding to the unevenness.

Next, referring to FIG. 3B, after the core retainer plate 130 has moved toward and couples to the cavity retainer plate 110, and an injector 140 injects a material such as, for example, resin 150 to the forming space 113 via a nozzle 132 arranged in the core retainer plate 130. The inmold film 120 adheres to the hairline 112 of the cavity retainer plate 110 due to the injection of the resin 150, and the injected resin 150 adheres to the inmold film 120. Next, cooling water circulates and the inmold film 120 and the resin 150 disposed in the forming space 113 are cooled down.

Now, referring to FIG. 3C, the core retainer plate 130 is separated (decoupled/moved away) from the cavity retainer plate 110, and the PET film 121 is separated from and a housing 10 is completed via this process. The housing 10 represents a first hairline 1122 corresponding to a hairline 112 of the inmold mold 105 on the whole, and represents a second hairline 122 of the inmold film 120 along the first hairline 1122 in detail. Consequently, since the housing 10 according to the present invention represents the hairline 1122 by the inmold mold 105 and the hairline 122 of the inmold film 120 simultaneously, the housing 10 has texture of real metal.

The above-described methods according to the present invention can be implemented in hardware, firmware or as software or computer code that is stored in a recording medium such as a CD ROM, flash, EPROM, EEPROM, RAM, a floppy disk, thumbnail drive, a hard disk, or a magneto-optical disk, or computer code downloaded over a network originally stored on a remote recording medium and then stored on a non-transitory medium and loaded into hardware such as a processor, microprocessor, or controller. The machine executable code stored on the non-transitory machine readable medium can be stored on a local recording medium, and is loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor", "microprocessor" or "unit" comprises hardware in the claimed invention. Finally, the claimed invention can include the use of a location information server comprising more than one server, such as a proxy server. Under the broadest reasonable interpretation, the claimed invention constitutes statutory subject matter in view of 35 U.S.C. §101 and does not constitute software per se.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described examples but should be determined by not only the appended claims but also the equivalents thereof.

What is claimed is:

1. A method for manufacturing a housing, comprising:
positioning an in-mold film including a first hairline inside a mold, wherein the mold includes a second hairline, and the first hairline is aligned and overlapping with the second hairline when the in-mold film is positioned into the mold; and
injecting resin into the mold to form the housing.

2. The method of claim 1, wherein the second hairline is formed on an inner surface of a core retainer plate of the mold.

3. The method of claim 1, wherein the second hairline is formed on the mold by using one of a brush, a sandpaper, a laser, and etching.

4. The method of claim 1, wherein the first hairline is formed on the in-mold film by applying a coating layer onto a Polyethylene Terephthalate (PET) film layer.

5. The method of claim 4, wherein the PET film layer is separated from the coating layer by a release layer, and the coating layer serves as an exposed surface of the housing.

6. The method of claim 1, wherein the first hairline is formed in a print layer of the in-mold film.

7. The method of claim 1, wherein the in-mold film includes a base layer coupled to a coating layer via a release layer, the method further comprising separating the base layer from the coating layer after the housing is formed.

8. The method of claim 1, wherein:
the first hairline has a first surface profile and the second hairline has a second surface profile, and
the housing includes a third hairline having a third surface profile that is derived from the first surface profile and the second surface profile.

9. A housing having a housing hairline, comprising:
a base: and
a coating layer formed on the base,
wherein the housing is formed by positioning an in-mold film including the coating layer into a mold and injecting resin into the mold to produce the base, and
wherein a first hairline of the in-mold film is aligned and overlapping with a second hairline of the mold when the in-mold film is inserted into the mold.

10. The housing of claim 9, wherein the second hairline is formed on an inner surface of a core retainer plate of the mold.

11. The housing of claim 9, wherein the second hairline is formed on the mold by using one of a brush, a sandpaper, a laser, or etching.

12. The housing of claim 9, wherein the first hairline is formed on the in-mold film by applying the coating layer onto a Polyethylene Terephthalate (PET) film layer having.

13. The housing of claim 12, wherein the PET film layer is separated from the coating layer after the coating layer is cured.

14. The housing of claim 9, wherein a print layer including the first hairline is arranged on the in-mold film.

15. The housing of claim 9, wherein the in-mold film includes a base layer coupled to the coating layer via a release layer, and the base layer is separated from the coating layer after the housing is formed.

16. The housing of claim 9, wherein:
the first hairline has a first surface profile and the second hairline has a second surface profile, and
the housing includes a third hairline having a third surface profile that is derived from the first surface profile and the second surface profile.

17. A portable terminal comprising:
a plurality of electronic parts including a wireless communication unit, a controller, a memory, and a touchscreen display; and
a housing having a hollowed space for receiving the electronic parts, said housing forming an exterior appearance of at least a portion of the portable terminal,
wherein the housing is formed by positioning an in-mold film into a mold and injecting resin into the mold, and
wherein a first hairline of the in-mold film is aligned and overlapping with a second hairline of the mold when the in-mold film is positioned into the mold.

18. The portable terminal of claim 17, wherein the second hairline is formed on the mold by using one or more of a brush, a sandpaper, a laser, or etching.

19. The portable terminal of claim 17, wherein the first hairline is formed by applying a coating layer onto a Polyethylene Terephthalate (PET) film layer.

20. The portable terminal of claim 19, wherein the PET film layer is separated from the coating layer by a release layer, and wherein the coating layer serves as an exposed surface of the housing.

21. The portable terminal of claim 17, wherein a print layer comprising the first hairline is arranged on the in-mold film.

22. The portable terminal of claim 21, wherein the in-mold film includes a base layer coupled to a coating layer via a release layer, and the base layer is separated from the coating layer after the housing is formed.

23. The portable terminal of claim 17, wherein the housing includes a separable battery cover.

24. The portable terminal of claim 17, wherein the housing comprises at least one of:
   a front housing;
   a rear housing that detachably couples to the front housing to form the space for receiving the electronic parts; and
   a separable rear cover that detachably couples to the rear housing to form a space for receiving a battery.

25. The portable terminal of claim 17, wherein:
   the first hairline has a first surface profile and the second hairline has a second surface profile, and
   the housing includes a third hairline having a third surface profile that is derived from the first surface profile and the second surface profile.

* * * * *